(12) United States Patent
Wu et al.

(10) Patent No.: US 12,512,431 B2
(45) Date of Patent: Dec. 30, 2025

(54) APPARATUS AND METHOD FOR WAFER OXIDE REMOVAL AND REFLOW TREATMENT

(71) Applicant: Air Products and Chemicals, Inc., Allentown, PA (US)

(72) Inventors: Liang Wu, Shanghai (CN); Wenshan Pang, Shanghai (CN); Lulu Qi, Shanghai (CN); Xiang Yu, Shanghai (CN); Leijian Yu, Shanghai (CN); Jiong Chen, Shanghai (CN); Gregory Khosrov Arslanian, Pipersville, PA (US); Yuxiang Zhou, Shanghai (CN)

(73) Assignee: Air Products and Chemicals, Inc., Allentown, PA (US)

( * ) Notice: Subject to any disclaimer, the term of this patent is extended or adjusted under 35 U.S.C. 154(b) by 426 days.

(21) Appl. No.: 18/111,134

(22) Filed: Feb. 17, 2023

(65) Prior Publication Data
US 2024/0282734 A1    Aug. 22, 2024

(51) Int. Cl.
*H01L 23/00*     (2006.01)
(52) U.S. Cl.
CPC ............ *H01L 24/11* (2013.01); *H01L 24/742* (2013.01); *H01L 24/75* (2013.01); *H01L 24/81* (2013.01); *H01L 2224/117* (2013.01); *H01L 2224/1181* (2013.01); *H01L 2224/11849* (2013.01); *H01L 2224/742* (2013.01); *H01L 2224/7501* (2013.01); *H01L 2224/75251* (2013.01); *H01L 2224/81022* (2013.01); *H01L 2224/81211* (2013.01); *H01L 2224/81815* (2013.01); *H01L 2224/81908* (2013.01); *H01L 2924/40* (2013.01)

(58) Field of Classification Search
CPC ........... H01L 24/75; H01L 2224/75251; H01L 2224/75801; H01L 2224/75802; H01L 2224/759; H01L 2224/1181; H01L 2224/11826; H01L 2224/81097; H01L 2224/11849; H01L 2224/7501
See application file for complete search history.

(56) References Cited

U.S. PATENT DOCUMENTS

| | | | |
|---|---|---|---|
| 7,601,271 B2 * | 10/2009 | Kerdiles | ............. H01L 21/2007 156/60 |
| 8,454,850 B2 * | 6/2013 | Dong | ..................... B23K 1/206 134/1.1 |
| 8,593,778 B2 | 11/2013 | Dong et al. | |
| 8,617,352 B2 | 12/2013 | Dong et al. | |

(Continued)

FOREIGN PATENT DOCUMENTS

| | | |
|---|---|---|
| EP | 2292360 | 3/2011 |
| JP | 2003282461 | 10/2003 |

(Continued)

*Primary Examiner* — David A Zarneke
(74) *Attorney, Agent, or Firm* — Amy C. Trexler

(57) ABSTRACT

The present invention relates to an apparatus and method for wafer oxide removal and reflow treatment. In particular, the present invention relates to an apparatus for wafer oxide removal and reflow treatment, comprising: a heating plate, a sample plate for supporting a wafer sample above the heating plate, and an electron attachment pin plate above the sample plate, wherein the heating plate is configured to be capable of moving up and down, and contacting and heating the sample plate.

13 Claims, 2 Drawing Sheets

(56) References Cited

U.S. PATENT DOCUMENTS

| | | | | |
|---|---|---|---|---|
| 8,922,027 | B2* | 12/2014 | Sakai | H01L 24/13 257/781 |
| 9,006,975 | B2 | 4/2015 | Dong et al. | |
| 9,911,710 | B2* | 3/2018 | Celia, Jr. | B23K 37/0408 |
| 10,840,213 | B2* | 11/2020 | Matsunaga | H01L 24/83 |
| 10,861,820 | B2* | 12/2020 | Bajwa | H01L 24/75 |
| 11,444,053 | B2* | 9/2022 | Karim | H01L 24/81 |
| 11,465,225 | B1* | 10/2022 | Jing | H01L 24/742 |
| 2003/0164394 | A1* | 9/2003 | Suga | B23K 1/20 228/110.1 |
| 2004/0169020 | A1* | 9/2004 | Yamauchi | H01L 21/4864 219/121.46 |
| 2007/0105459 | A1* | 5/2007 | Aruga | H01L 21/4835 257/E23.011 |
| 2018/0050425 | A1 | 2/2018 | Chen et al. | |

FOREIGN PATENT DOCUMENTS

| | | |
|---|---|---|
| JP | 2006310374 | 11/2006 |
| JP | 2007181879 | 7/2007 |
| JP | 2011054973 | 3/2011 |
| JP | 2013187320 | 9/2013 |
| JP | 2020529922 | 10/2020 |
| JP | 2020530197 | 10/2020 |
| KR | 19980042357 | 8/1998 |
| KR | 100605334 | 7/2006 |
| KR | 20150081723 | 7/2015 |
| TW | 201110214 | 3/2011 |
| TW | 201342510 | 10/2013 |

\* cited by examiner

APPARATUS AND METHOD FOR WAFER OXIDE REMOVAL AND REFLOW TREATMENT

TECHNICAL FIELD

The present invention relates to wafer treatment, in particular to wafer oxide removal and reflow treatment.

BACKGROUND OF THE INVENTION

Wafer bumping is a process used to make thick metal bumps on the chip bond pads for inner lead bonding. The bumps are commonly made by depositing solder on the pads and then reflowing (referred to herein as a first reflow) to conduct alloying and to change the shape of the solder bump from a mushroom-shape into a hemispherical-shape. The chip with the first-reflowed bumps is "flipped" to correspond to the footprint of the solder wettable terminals on the sub¬strate and then subjected to a second reflow to form solder joints.

Reflow and soldering are important processing steps in the assembly of electronics components for making solder joints. The term "reflow" refers to a process for making a previously applied solder on a substrate melt and flow upon application of an energy source such as, for example, thermal energy.

To ensure a good wetting of the molten solder on the joining surfaces, organic fluxes are normally contained in the solder pastes to remove initial surface oxides on both solder and base metal and to keep the surfaces in a clean state before solidification.

Electron attachment is known in the art.

BRIEF SUMMARY OF THE INVENTION

The present disclosure aims to provide a batch fluxless process for wafer bumping/reflow, in particular for wafer oxide removal and reflow treatment. The present disclosure also aims to provide fast heating and cooling of the sample plate.

The present disclosure provides an apparatus for wafer oxide removal and reflow treatment, comprising a heating plate, a sample plate for supporting a wafer sample above the heating plate, and an electron attachment pin plate above the sample plate, wherein the heating plate is configured to be capable of moving up and down, and contacting and heating the sample plate.

The present disclosure also provides a method for wafer oxide removal and reflow treatment with the apparatus of the present disclosure, comprising moving the heating plate up to contact and lift the sample plate until the surface of the wafer sample on the sample plate is close enough to the electron attachment pin plate to be treated by electron attachment, heating the wafer sample on the sample plate when the heating plate is in contact with the sample plate, removing oxide on the surface of the wafer sample by electron attachment, and moving the heating plate down until the sample plate sits on a shelf and is separated from the heating plate.

With the apparatus and method, the wafer oxide removal and reflow treatment can be performed by stepwise processing, such as for a wafer up to 12" in length and/or width and/or diameter. The separation of the sample plate supporting the wafer sample from the heating plate after reflowing is fulfilled for rapid and controlled sample cooling.

DETAILED DESCRIPTION OF THE INVENTION

Figure 1:
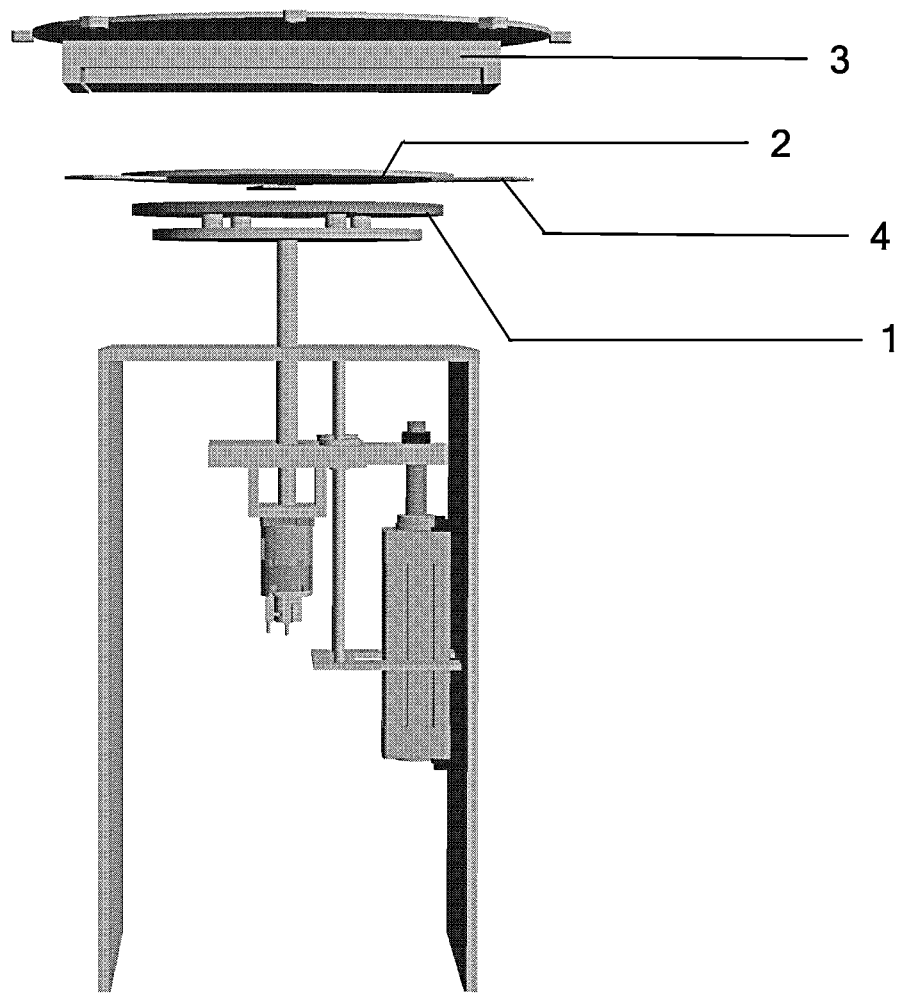
FIG. 1 is a drawing showing the structure of the apparatus of the present disclosure.

In one aspect, the present disclosure relates to an apparatus for wafer oxide removal and reflow treatment, comprising a heating plate, a sample plate for supporting a wafer sample above the heating plate, and an electron attachment pin plate above the sample plate, wherein the heating plate is configured to be capable of moving up and down, and contacting and heating the sample plate.

In one aspect, the heating plate is further configured to be capable of rotating. The rotation of the heating plate supporting the sample plate can provide uniform oxide removal of the sample surface.

In one aspect, the heating plate is controlled by air cylinders or screw rods for up and down movement and/or rotation.

In one aspect, the heating plate is capable of contacting and heating the sample plate at a heating rate up to 50° C./min to a temperature up to 500° C.

In one aspect, the apparatus further comprises a shelf for supporting the sample plate, wherein the shelf is located between the sample plate and the heating plate and configured to allow the heating plate to lift the sample plate.

In one aspect, the shelf is separated from the electron attachment pin plate, so that when the sample plate sits on the shelf, the gap between the sample surface of the wafer sample on the sample plate and the pin tips of the electron attachment pin plate is greater than 10 mm.

In one aspect, the heating plate, the sample plate, and the electron attachment pin plate are contained in a chamber.

In one aspect, the electron attachment pin plate is capable of emitting electrons which collide with hydrogen molecules to produce hydrogen anions to reduce oxides to metal and produce water vapor.

In one aspect, the apparatus comprises an electron attachment kit comprising the electron attachment pin plate, a high voltage power supply, and a pulse generator.

In one aspect, the apparatus comprises a heating subsystem comprising the heating plate and a heating control means.

In one aspect, the heating plate is made of silicon nitride.

In one aspect, the apparatus comprises a gas delivery means of N2, H2, or a mixture thereof.

In one aspect, the apparatus comprises a monitoring system for monitoring a H2 or O2 content, a gas flow rate, a chamber pressure, a temperature, or a cooling water flow.

In one aspect, the apparatus comprises a camera or video for monitoring the inside of the chamber.

In one aspect, the present disclosure relates to a method for wafer oxide removal and reflow treatment with the apparatus according to the present disclosure, comprising moving the heating plate up to contact and lift the sample plate until the surface of the wafer sample on the sample plate is close enough to the electron attachment pin plate to be treated by electron attachment, heating the wafer sample on the sample plate when the heating plate is in contact with the sample plate, removing oxide on the surface of the wafer sample by electron attachment, and moving the heating plate down until the sample plate sits on a shelf and is separated from the heating plate.

When the sample plate sits on the shelf as the heating plate moves down, the sample plate is separated from the heating plate. The separation of the sample plate supporting the wafer sample from the heating plate after reflowing is fulfilled for rapid and controlled sample cooling.

In one aspect, the wafer sample is heated at a heating rate up to 50° C./min to a temperature up to 500° C.

In one aspect, the heating plate is rotated to obtain the uniform oxide removal. When the heating plate supports the sample plate, the rotation of the heating plate supporting the sample plate can provide uniform oxide removal of the sample surface.

In one aspect, the sample plate is lifted by the heating plate until the gap between the sample surface of the wafer sample on the sample plate and the pin tips of the electron attachment pin plate is no greater than 10 mm.

In one aspect, the heating plate, the sample plate, and the electron attachment pin plate are contained in a chamber, the chamber is under vacuum or comprises N2 to achieve an oxygen content of no greater than 10 ppm, and thereafter switched to N2/H2 mixed gas.

In one aspect, the apparatus comprises a positive and negative power supply and a pulse generator for the electron attachment, the heating plate, the sample plate, and the electron attachment pin plate are contained in a chamber, and the method comprises the following steps: turning on N2 purging to purge the chamber, moving the heating plate and sample plate up, while maintaining O2 below a predetermined value (e.g., 20 ppm), starting heating and delivering H2/N2 gas mixture, turning on rotation of the heating plate, enabling the positive and negative power supply, switching on the pulse generator, switching off H2/N2 gas mixture and switching back to N2 purging, switching off the pulse generator, turning off the rotation, continuing heating to a predetermined reflow temperature (e.g., 260° C.) for reflow treatment, and, after the completion of the reflow treatment, moving the heating plate down away from the sample plate.

The full process can be completed within one hour including preheating, electron attachment de-oxidation (including temperature soaking and electron attachment stabilization), reflow and cooling, and is a low-cost process.

The apparatus or method is environmentally friendly, and is applicable to a small-scale batch process. The apparatus or method is suited for R&D purposes, such as in R&D centers, universities, research institutes and IC packaging companies.

Reference is made to FIG. 1. FIG. 1 is a drawing showing the structure of the apparatus of the present disclosure. The apparatus comprises a heating plate 1, a sample plate 2 for supporting a wafer sample above the heating plate, an electron attachment pin plate 3 above the sample plate, and a shelf 4 for supporting the sample plate. The heating plate 1 is configured to be capable of moving up and down, and contacting and heating the sample plate 2. The heating plate 1 is also capable of rotating. The heating plate 1 is controlled by air cylinders or screw rods for up and down movement and/or rotation. The shelf 4 is located between the sample plate 2 and the heating plate 1 and configured to allow the heating plate 1 to lift the sample plate 2. The shelf 4 is separated from the electron attachment pin plate 3, so that when the sample plate 2 sits on the shelf 4, the gap between the sample surface of the wafer sample on the sample plate 2 and the pin tips of the electron attachment pin plate 3 is greater than 10 mm. The electron attachment pin plate 3 is capable of emitting electrons which collide with hydrogen molecules to produce hydrogen anions to reduce oxides to metal and produce water vapor.

Figure 2:
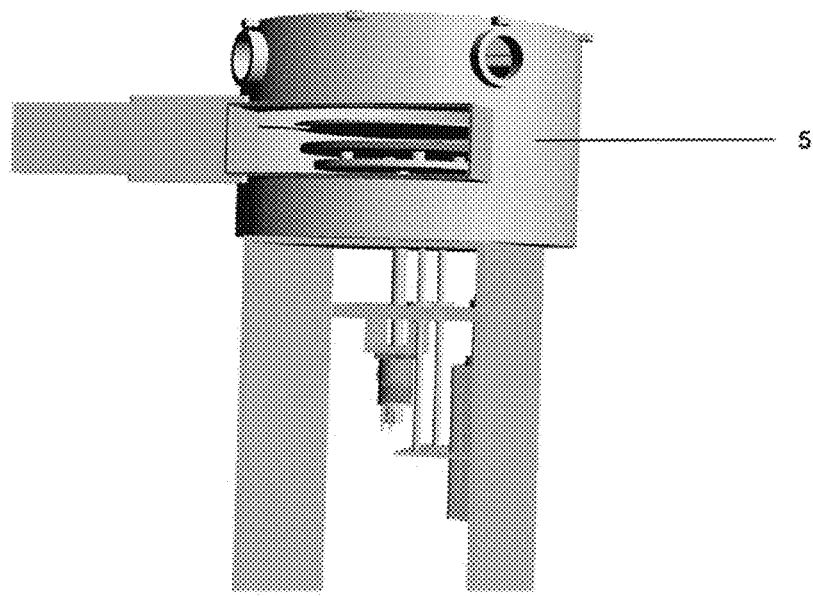
FIG. 2 is another drawing showing the structure of the apparatus of the present disclosure.

FIG. 2 is another drawing showing the structure of the apparatus of the present disclosure. The heating plate, the sample plate, and the electron attachment pin plate are contained in a chamber 5.

The apparatus can be used in a method for wafer oxide removal and reflow treatment. The method comprises the following steps: moving the heating plate 1 up to contact and lift the sample plate 2 until the surface of the wafer sample on the sample plate 2 is close enough to the electron attachment pin plate 3 to be treated by electron attachment, for example, the sample plate 2 is lifted by the heating plate 1 until the gap between the sample surface of the wafer sample on the sample plate 2 and the pin tips of the electron attachment pin plate 3 is no greater than 10 mm; heating the wafer sample on the sample plate 2 when the heating plate 1 is in contact with the sample plate 2; removing oxide on the surface of the wafer sample by electron attachment; and moving the heating plate 1 down until the sample plate 2 sits on the shelf and is separated from the heating plate 1. The heating plate 1 can be rotated to obtain the uniform oxide removal.

The method can specifically comprise the following steps: turning on N2 purging to purge the chamber; moving the heating plate and sample plate up, while maintaining O2 below a predetermined value (e.g., 20 ppm); starting heating and delivering H2/N2 gas mixture; turning on rotation of the heating plate; enabling the positive and negative power supply; switching on the pulse generator; switching off H2/N2 gas mixture and switching back to N2 purging; switching off the pulse generator; turning off the rotation; continuing heating to a predetermined reflow temperature (e.g., 260° C.) for reflow treatment; after the completion of the reflow treatment, moving the heating plate down away from the sample plate.

Although the present invention is described with reference to the preferred embodiments depicted by the drawings, it is understood that various modifications are possible within the spirit or scope of the present invention.

The invention claimed is:

1. An apparatus for wafer oxide removal and reflow treatment, comprising:
   a heating plate,
   a sample plate for supporting a wafer sample above the heating plate, and
   an electron attachment pin plate above the sample plate,
   wherein the heating plate is configured to be capable of moving up and down, and contacting and heating the sample further comprising a shelf for supporting the sample plate, wherein the shelf is located between the sample plate and the heating plate and configured to allow the heating plate to lift the sample plate.

2. The apparatus according to claim 1, wherein the heating plate is further configured to be capable of rotating.

3. The apparatus according to claim 2, wherein the heating plate is controlled by air cylinders or screw rods for up and down movement and/or rotation.

4. The apparatus according to claim 1, wherein the heating plate is capable of contacting and heating the sample plate at a heating rate up to 50° C./min to a temperature up to 500° C.

5. The apparatus according to claim 1, wherein the shelf is separated from the electron attachment pin plate, so that when the sample plate sits on the shelf, the gap between the sample surface of the wafer sample on the sample plate and the pin tips of the electron attachment pin plate is greater than 10 mm.

6. The apparatus according to claim 1, wherein the heating plate, the sample plate, and the electron attachment pin plate are contained in a chamber.

7. The apparatus according to claim 1, wherein the electron attachment pin plate is capable of emitting electrons which collide with hydrogen molecules to produce hydrogen anions to reduce oxides to metal and produce water vapor.

8. The apparatus according to claim 1, wherein the apparatus comprises an electron attachment kit comprising the electron attachment pin plate, a high voltage power supply, and a pulse generator.

9. The apparatus according to claim 1, wherein the apparatus comprises a heating subsystem comprising the heating plate and a heating control means.

10. The apparatus according to claim 1, wherein the heating plate is made of silicon nitride.

11. The apparatus according to claim 1, wherein the apparatus comprises a gas delivery means of $N_2$, $H_2$, or a mixture thereof.

12. The apparatus according to claim 6, wherein the apparatus comprises a monitoring system for monitoring a $H_2$ or $O_2$ content, a gas flow rate, a chamber pressure, a temperature, or a cooling water flow.

13. The apparatus according to claim 6, wherein the apparatus comprises a camera or video for monitoring the inside of the chamber.

\* \* \* \* \*